(12) United States Patent
Lu (10) Patent No.: US 8,071,480 B2
(45) Date of Patent: *Dec. 6, 2011

(54) METHOD AND APPARATUSES FOR REMOVING POLYSILICON FROM SEMICONDUCTOR WORKPIECES

(75) Inventor: Jin Lu, Manassas, VA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/818,019

(22) Filed: Jun. 17, 2010

(65) Prior Publication Data

US 2010/0267239 A1 Oct. 21, 2010

Related U.S. Application Data

(63) Continuation of application No. 11/686,079, filed on Mar. 14, 2007, now Pat. No. 7,754,612.

(51) Int. Cl.
*H01L 21/302* (2006.01)
*H01L 21/461* (2006.01)

(52) U.S. Cl. ......... 438/692; 257/E21.224; 257/E21.228; 257/E21.23; 257/E21.307; 438/690; 438/753

(58) Field of Classification Search ........... 257/E21.224, 257/E21.228, E21.23, E21.307; 438/690, 438/692, 753

See application file for complete search history.

(56) References Cited

U.S. PATENT DOCUMENTS

| | | | |
|---|---|---|---|
| 5,081,796 A | 1/1992 | Schultz | |
| 5,209,816 A | 5/1993 | Yu et al. | |
| 5,225,034 A | 7/1993 | Yu et al. | |
| 5,232,875 A | 8/1993 | Tuttle et al. | |
| 5,234,867 A | 8/1993 | Schultz et al. | |
| 5,240,552 A | 8/1993 | Yu et al. | |
| 5,244,534 A | 9/1993 | Yu et al. | |
| 5,245,790 A | 9/1993 | Jerbic | |
| 5,245,796 A | 9/1993 | Miller et al. | |
| RE34,425 E | 11/1993 | Schultz | |
| 5,354,490 A | 10/1994 | Yu et al. | |
| 5,421,769 A | 6/1995 | Schultz et al. | |
| 5,433,651 A | 7/1995 | Lustig et al. | |
| 5,449,314 A | 9/1995 | Meikle et al. | |
| 5,486,129 A | 1/1996 | Sandhu et al. | |

(Continued)

OTHER PUBLICATIONS

Kondo, S. et al., "Abrasive-Free Polishing for Copper Damascene Interconnection," Journal of The Electrochemical Society, vol. 147, No. 10, pp. 3907-3913, The Electrochemical Society, Inc., Pennington, New Jersey, 2000.

*Primary Examiner* — Asok Sarkar
(74) *Attorney, Agent, or Firm* — Perkins Coie LLP (57) ABSTRACT

Methods and apparatuses for removing polysilicon material from a semiconductor workpiece are disclosed. A particular method includes contacting a polishing pad with a semiconductor workpiece having a surface polysilicon material. The method also includes disposing a polishing liquid between the polysilicon material and the polishing pad. The polishing liquid contains an oxidizer that does not include metal elements. The method further includes moving at least one of the semiconductor workpiece and the polishing pad relative to the other while the semiconductor workpiece contacts the polishing pad and the polishing liquid. At least some of the polysilicon material is removed while the polysilicon material contacts the oxidizer in the polishing liquid, as at least one of the semiconductor workpiece and the polishing pad moves relative to the other.

19 Claims, 7 Drawing Sheets

U.S. PATENT DOCUMENTS

| | | | |
|---|---|---|---|
| 5,489,557 A * | 2/1996 | Jolley | 438/476 |
| 5,514,245 A | 5/1996 | Doan et al. | |
| 5,533,924 A | 7/1996 | Stroupe et al. | |
| 5,540,810 A | 7/1996 | Sandhu et al. | |
| 5,616,069 A | 4/1997 | Walker et al. | |
| 5,618,381 A | 4/1997 | Doan et al. | |
| 5,643,060 A | 7/1997 | Sandhu et al. | |
| 5,645,682 A | 7/1997 | Skrovan | |
| 5,655,951 A | 8/1997 | Meikle et al. | |
| 5,658,183 A | 8/1997 | Sandhu et al. | |
| 5,658,190 A | 8/1997 | Wright et al. | |
| 5,664,988 A | 9/1997 | Stroupe et al. | |
| 5,679,065 A | 10/1997 | Henderson | |
| 5,679,169 A | 10/1997 | Gonzales et al. | |
| 5,702,292 A | 12/1997 | Brunelli et al. | |
| 5,725,417 A | 3/1998 | Robinson | |
| 5,730,642 A | 3/1998 | Sandhu et al. | |
| 5,747,386 A | 5/1998 | Moore | |
| 5,779,522 A | 7/1998 | Walker et al. | |
| 5,782,675 A | 7/1998 | Southwick | |
| 5,792,709 A | 8/1998 | Robinson et al. | |
| 5,795,495 A | 8/1998 | Meikle | |
| 5,801,066 A | 9/1998 | Meikle | |
| 5,807,165 A | 9/1998 | Uzoh et al. | |
| 5,827,781 A | 10/1998 | Skrovan et al. | |
| 5,830,806 A | 11/1998 | Hudson et al. | |
| 5,833,519 A | 11/1998 | Moore | |
| 5,846,336 A | 12/1998 | Skrovan | |
| 5,851,135 A | 12/1998 | Sandhu et al. | |
| 5,868,896 A | 2/1999 | Robinson et al. | |
| 5,879,226 A | 3/1999 | Robinson | |
| 5,882,248 A | 3/1999 | Wright et al. | |
| 5,893,754 A | 4/1999 | Robinson et al. | |
| 5,894,852 A | 4/1999 | Gonzales et al. | |
| 5,895,550 A | 4/1999 | Andreas | |
| 5,910,043 A | 6/1999 | Manzonie et al. | |
| 5,916,819 A | 6/1999 | Skrovan et al. | |
| 5,934,980 A | 8/1999 | Koos et al. | |
| 5,945,347 A | 8/1999 | Wright | |
| 5,954,912 A | 9/1999 | Moore | |
| 5,967,030 A | 10/1999 | Blalock | |
| 5,972,792 A | 10/1999 | Hudson | |
| 5,975,994 A | 11/1999 | Sandhu et al. | |
| 5,980,363 A | 11/1999 | Meikle et al. | |
| 5,981,396 A | 11/1999 | Robinson et al. | |
| 5,990,012 A | 11/1999 | Robinson et al. | |
| 5,994,224 A | 11/1999 | Sandhu et al. | |
| 5,997,384 A | 12/1999 | Blalock | |
| 6,004,196 A | 12/1999 | Doan et al. | |
| 6,007,406 A | 12/1999 | Custer et al. | |
| 6,039,633 A | 3/2000 | Chopra | |
| 6,040,245 A | 3/2000 | Sandhu et al. | |
| 6,054,015 A | 4/2000 | Brunelli et al. | |
| 6,059,920 A * | 5/2000 | Nojo et al. | 156/345.12 |
| 6,060,395 A | 5/2000 | Skrovan et al. | |
| 6,066,030 A | 5/2000 | Uzoh | |
| 6,074,286 A | 6/2000 | Ball | |
| 6,077,785 A | 6/2000 | Andreas | |
| 6,083,085 A | 7/2000 | Lankford | |
| 6,110,820 A | 8/2000 | Sandhu et al. | |
| 6,116,988 A | 9/2000 | Ball | |
| 6,120,354 A | 9/2000 | Koos et al. | |
| 6,124,207 A | 9/2000 | Robinson et al. | |
| 6,125,255 A | 9/2000 | Litman | |
| 6,135,856 A | 10/2000 | Tjaden | |
| 6,136,218 A | 10/2000 | Skrovan et al. | |
| 6,139,402 A | 10/2000 | Moore | |
| 6,143,123 A | 11/2000 | Robinson et al. | |
| 6,143,155 A | 11/2000 | Adams et al. | |
| 6,152,808 A | 11/2000 | Moore | |
| 6,176,763 B1 | 1/2001 | Kramer et al. | |
| 6,176,992 B1 | 1/2001 | Talieh | |
| 6,187,681 B1 | 2/2001 | Moore | |
| 6,191,037 B1 | 2/2001 | Robinson et al. | |
| 6,193,588 B1 | 2/2001 | Carlson et al. | |
| 6,196,899 B1 | 3/2001 | Chopra et al. | |
| 6,200,196 B1 | 3/2001 | Custer et al. | |
| 6,200,901 B1 | 3/2001 | Hudson et al. | |
| 6,203,404 B1 | 3/2001 | Joslyn et al. | |
| 6,203,413 B1 | 3/2001 | Skrovan | |
| 6,206,756 B1 | 3/2001 | Chopra et al. | |
| 6,206,757 B1 | 3/2001 | Custer et al. | |
| 6,210,257 B1 | 4/2001 | Carlson | |
| 6,213,845 B1 | 4/2001 | Elledge | |
| 6,218,316 B1 | 4/2001 | Marsh | |
| 6,220,934 B1 | 4/2001 | Sharples et al. | |
| 6,227,955 B1 | 5/2001 | Custer et al. | |
| 6,234,874 B1 | 5/2001 | Ball | |
| 6,234,877 B1 | 5/2001 | Koos et al. | |
| 6,234,878 B1 | 5/2001 | Moore | |
| 6,237,483 B1 | 5/2001 | Blalock | |
| 6,238,270 B1 | 5/2001 | Robinson | |
| 6,244,944 B1 | 6/2001 | Elledge | |
| 6,250,994 B1 | 6/2001 | Chopra et al. | |
| 6,251,785 B1 | 6/2001 | Wright | |
| 6,261,151 B1 | 7/2001 | Sandhu et al. | |
| 6,261,163 B1 | 7/2001 | Walker et al. | |
| 6,267,650 B1 | 7/2001 | Hembree | |
| 6,271,139 B1 | 8/2001 | Alwan et al. | |
| 6,273,101 B1 | 8/2001 | Gonzales et al. | |
| 6,273,786 B1 | 8/2001 | Chopra et al. | |
| 6,273,796 B1 | 8/2001 | Moore | |
| 6,273,800 B1 | 8/2001 | Walker et al. | |
| 6,276,996 B1 | 8/2001 | Chopra | |
| 6,306,008 B1 | 10/2001 | Moore | |
| 6,306,012 B1 | 10/2001 | Sabde | |
| 6,306,014 B1 | 10/2001 | Walker et al. | |
| 6,306,768 B1 | 10/2001 | Klein | |
| 6,312,486 B1 | 11/2001 | Sandhu et al. | |
| 6,312,558 B2 | 11/2001 | Moore | |
| 6,313,038 B1 | 11/2001 | Chopra et al. | |
| 6,328,632 B1 | 12/2001 | Chopra | |
| 6,331,139 B2 | 12/2001 | Walker et al. | |
| 6,331,488 B1 | 12/2001 | Doan et al. | |
| 6,350,180 B2 | 2/2002 | Southwick | |
| 6,350,691 B1 | 2/2002 | Lankford | |
| 6,352,466 B1 | 3/2002 | Moore | |
| 6,352,470 B2 | 3/2002 | Elledge | |
| 6,354,917 B1 | 3/2002 | Ball | |
| 6,354,923 B1 | 3/2002 | Lankford | |
| 6,354,930 B1 | 3/2002 | Moore | |
| 6,358,122 B1 | 3/2002 | Sabde et al. | |
| 6,358,127 B1 | 3/2002 | Carlson et al. | |
| 6,358,129 B2 | 3/2002 | Dow | |
| 6,361,411 B1 | 3/2002 | Chopra et al. | |
| 6,361,413 B1 | 3/2002 | Skrovan | |
| 6,361,417 B2 | 3/2002 | Walker et al. | |
| 6,364,757 B2 | 4/2002 | Moore | |
| 6,368,190 B1 | 4/2002 | Easter et al. | |
| 6,368,193 B1 | 4/2002 | Carlson et al. | |
| 6,368,194 B1 | 4/2002 | Sharples et al. | |
| 6,368,197 B2 | 4/2002 | Elledge | |
| 6,375,548 B1 | 4/2002 | Andreas | |
| 6,376,381 B1 | 4/2002 | Sabde | |
| 6,383,934 B1 | 5/2002 | Sabde et al. | |
| 6,387,289 B1 | 5/2002 | Wright | |
| 6,395,620 B1 | 5/2002 | Pan et al. | |
| 6,402,884 B1 | 6/2002 | Robinson et al. | |
| 6,407,000 B1 | 6/2002 | Hudson | |
| 6,428,386 B1 | 8/2002 | Bartlett | |
| 6,431,959 B1 * | 8/2002 | Mikhaylich et al. | 451/41 |
| 6,447,369 B1 | 9/2002 | Moore | |
| 6,498,101 B1 | 12/2002 | Wang | |
| 6,511,576 B2 | 1/2003 | Klein | |
| 6,520,834 B1 | 2/2003 | Marshall | |
| 6,527,818 B2 * | 3/2003 | Hattori et al. | 51/308 |
| 6,533,893 B2 | 3/2003 | Sabde et al. | |
| 6,547,640 B2 | 4/2003 | Hofmann | |
| 6,548,407 B1 | 4/2003 | Chopra et al. | |
| 6,579,799 B2 | 6/2003 | Chopra et al. | |

| | | | | | |
|---|---|---|---|---|---|
| 6,592,443 B1 | 7/2003 | Kramer et al. | 6,666,749 B2 | 12/2003 | Taylor |
| 6,609,947 B1 | 8/2003 | Moore | 7,040,965 B2 | 5/2006 | Taylor et al. |
| 6,623,329 B1 | 9/2003 | Moore | 7,754,612 B2 * | 7/2010 | Lu .................................. 438/692 |
| 6,640,816 B2 | 11/2003 | Gonzales et al. | 2008/0233749 A1 | 9/2008 | Lu |
| 6,652,764 B1 | 11/2003 | Blalock | | | |

* cited by examiner

METHOD AND APPARATUSES FOR REMOVING POLYSILICON FROM SEMICONDUCTOR WORKPIECES

CROSS-REFERENCE TO RELATED APPLICATION

This application is a continuation of U.S. application Ser. No. 11/686,079 filed Mar. 14, 2007, now U.S. Pat. No. 7,754,612, which is incorporated herein by reference in its entirety.

TECHNICAL FIELD

The present disclosure relates to methods and apparatuses for removing polysilicon material from semiconductor workpieces.

BACKGROUND

Mechanical and chemical-mechanical polishing processes (collectively, "CMP") remove material from the surfaces of semiconductor workpieces in the production of microelectronic devices and other products. For example, many conventional semiconductor workpieces include polysilicon as a component for forming conductive and/or semi-conductive microelectronic structures (e.g., plugs or damascene lines). These polysilicon structures are typically formed by depositing a blanket polysilicon layer on a workpiece and removing the excess polysilicon material external to the plugs or damascene lines using a CMP process.

One problem associated with polishing polysilicon is that it is difficult to efficiently clean the workpiece surface after polishing. It appears that particles (e.g., abrasive elements from a polishing liquid and/or a polishing pad, particles removed from the workpiece, or other contaminants) can be adsorbed to the workpiece surface after the polysilicon material has been removed. Such adsorption can be strong enough to render conventional physical treatments (e.g., de-ionized water rinsing, megasonification, and brush cleaning) ineffective for removing at least some of the adsorbed contaminants from the workpiece surface after polishing.

One approach to addressing this problem is to treat the workpiece surface with a chemical solution after polishing. The chemical solution typically includes organic surfactants, hydrogen fluoride, ammonia hydroxide, and/or other suitable chemical compounds. A drawback with this approach is that the additional chemical treatment adds to the cost of the overall manufacturing process and reduces the product throughput. A further drawback is that the chemical treatment may use compounds (e.g., organic surfactants) that are not environmentally friendly, and may therefore be costly to dispose of. Accordingly, there is a need for an efficient and cost-effective technique for removing polysilicon materials from semiconductor workpieces.

DETAILED DESCRIPTION

Specific details of several embodiments of the disclosure are described below with reference to semiconductor workpieces and systems for processing the workpieces. The workpieces can include micromechanical components, data storage elements, optics, read/write components, or other features. For example, the workpieces can include workpieces having dies including SRAM, DRAM (e.g., DDR-SDRAM), flash-memory (e.g., NAND flash-memory), processor, imager, and/or other dies. Moreover, several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIG. 1-5.

A particular method for removing polysilicon material from a semiconductor workpiece includes contacting a polishing pad with a semiconductor workpiece having a surface polysilicon material. The method also includes disposing a polishing liquid between the polysilicon material and the polishing pad. The polishing liquid contains an oxidizer that does not include metal elements. The method further includes moving at least one of the semiconductor workpiece and the polishing pad relative to the other while the semiconductor workpiece contacts the polishing pad and the polishing liquid. As a result, at least some of the polysilicon material is removed while the polysilicon material is contacting the oxidizer in the polishing liquid, as at least one of the semiconductor workpiece and the polishing pad moves relative to the other.

Another particular method for polishing a semiconductor workpiece in a chemical-mechanical polishing process includes contacting a polishing pad and a polishing liquid with a portion of a semiconductor workpiece. The semiconductor workpiece has a polysilicon material at a surface facing toward the polishing pad, and the polishing liquid contains an oxidizer. The method also includes moving at least one of the semiconductor workpiece and the polishing pad relative to the other while the semiconductor workpiece contacts the polishing pad and the polishing liquid. At least a portion of the polysilicon material is removed from the surface of the semiconductor workpiece when at least one of the semiconductor workpiece and the polishing pad is moved relative to the other. The method further includes modifying an ability of the polysilicon material at the surface of the semiconductor workpiece to attract water, while removing at least a portion of the polysilicon material from the surface of the semiconductor workpiece.

Figure 1:
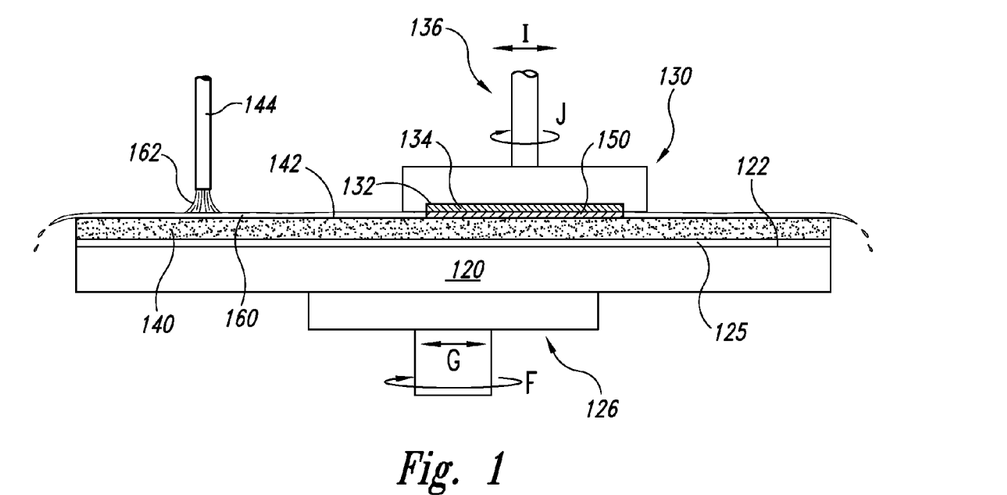
FIG. 1 is a partially schematic, cross-sectional side view of a portion of a rotary polishing machine suitable for conducting processes in accordance with embodiments of the disclosure.

FIG. 1 schematically illustrates a representative rotary CMP machine 110 on which the foregoing processes may be conducted. The CMP machine 110 can include a platen 120, a carrier head 130, and a polishing pad 140. The CMP machine 110 can also have an under-pad 125 between an upper surface 122 of the platen 120 and a lower surface of the polishing pad 140. A drive assembly 126 rotates the platen 120 (as indicated by arrow F) and/or reciprocates the platen 120 back and forth (as indicated by arrow G). Because the polishing pad 140 is attached to the under-pad 125, the polishing pad 140 moves with the platen 120 during polishing.

The carrier head 130 has a lower surface 132 to which a semiconductor workpiece 150 can be attached, or the workpiece 150 can be attached to a resilient pad 134 under the lower surface 132. The carrier head 130 can be a weighted, free-floating workpiece carrier, or an actuator assembly 136 can be attached to the carrier head 130 to impart rotational motion (as indicated by arrow J) and/or reciprocal motion (as indicated by arrow I) to the semiconductor workpiece 150.

In the illustrated embodiment, the rotary CMP machine 110 can also include an optional dispense conduit 144 for dispensing an oxidizing solution 162 onto the polishing pad 140. The oxidizing solution 162 can contain hydrogen peroxide ($H_2O_2$), an organic peroxide ROOR' (R and/or R'=$C_xH_y$, where x and y are positive integers), an organic hydroperoxide ROOH (R=$C_xH_y$, where x and y are positive integers), other suitable oxidizers that do not include metal elements, and/or combinations of any of the foregoing compounds. For example, the oxidizing solution 162 can include a combination of hydrogen peroxide, di-methyl peroxide, di-ethyl peroxide, methyl-ethyl peroxide, di-tert-butyl peroxide, and/or other suitable peroxides and hydroperoxides.

The polishing pad 140, a polishing solution 160, and the oxidizing solution 162 define a polishing medium that mechanically and/or chemically-mechanically removes material from the workpiece surface. The polishing solution 160 can include abrasive particles and chemicals suspended and/or dissolved in a liquid carrier (e.g., water). The abrasive particles and chemicals etch and/or oxidize the workpiece surface. The polishing solution 160 can also be a "clean" nonabrasive solution without abrasive particles. In most CMP applications, abrasive slurries with abrasive particles are used on non-abrasive polishing pads, and clean non-abrasive solutions without abrasive particles are used on fixed-abrasive polishing pads. The polishing liquid 160 can have an alkaline pH. For example, the polishing liquid 160 can include an alkaline silica slurry having potassium hydroxide (KOH), sodium hydroxide (NaOH), tetramethyl ammonium hydroxide ($N(CH_3)_4OH$), and/or piperazine ($C_4H_{10}N_2$). In other embodiments, the polishing liquid 160 can include other constituents that provide the appropriate pH.

To polish the semiconductor workpiece 150 with the CMP machine 110, the carrier head 130 presses the workpiece 150 facedown against the polishing pad 140. More specifically, the carrier head 130 generally presses the semiconductor workpiece 150 against the polishing solution 160 on a polishing surface 142 of the polishing pad 140, and the platen 120 and/or the carrier head 130 moves to rub the workpiece 150 against the polishing surface 142. As the semiconductor workpiece 150 rubs against the polishing surface 142, the polishing medium removes material from the face of the workpiece 150. The polishing liquid 160 mixed with the oxidizing solution 162 can also modify the surface chemistry of the semiconductor workpiece 150 while the polishing medium removes material from the face of the semiconductor workpiece 150, as described in more detail later with reference to FIGS. 4A-H.

Figure 2:
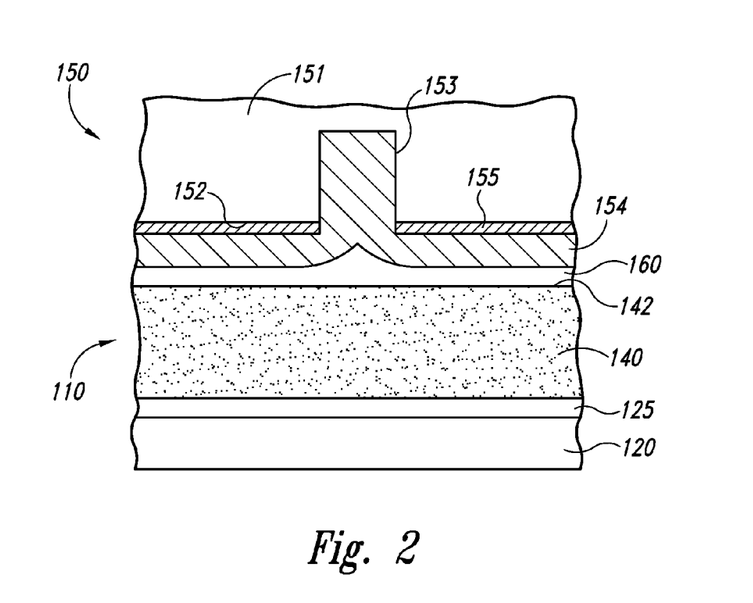
FIG. 2 is a partially schematic cross-sectional side view of a portion of the polishing apparatus shown in FIG. 1.

FIG. 2 is an enlarged schematic illustration of a portion of the apparatus 110 shown in FIG. 1. The semiconductor workpiece 150 can include a substrate material 151 (e.g., an oxide glass) having a substrate material surface 152. The semiconductor workpiece 150 can further include an aperture 153 extending from the substrate material surface 152. A polysilicon material 154 can be disposed in the aperture 153 and can extend over the substrate material surface 152 adjacent to the aperture 153. The polysilicon material 154 can include doped or un-doped polysilicon for forming a via, a damascene line, or other structures to electrically connect features within or on the substrate material 151. The semiconductor workpiece 150 can include an intermediate layer 155 between the substrate material surface 152 and the portion of the polysilicon material 154 disposed outwardly from the aperture 153. The intermediate layer 155 can include an anti-reflective coating, a stop layer, or another type of layer. In still further embodiments, the intermediate layer 155 can be eliminated.

Figure 3A:
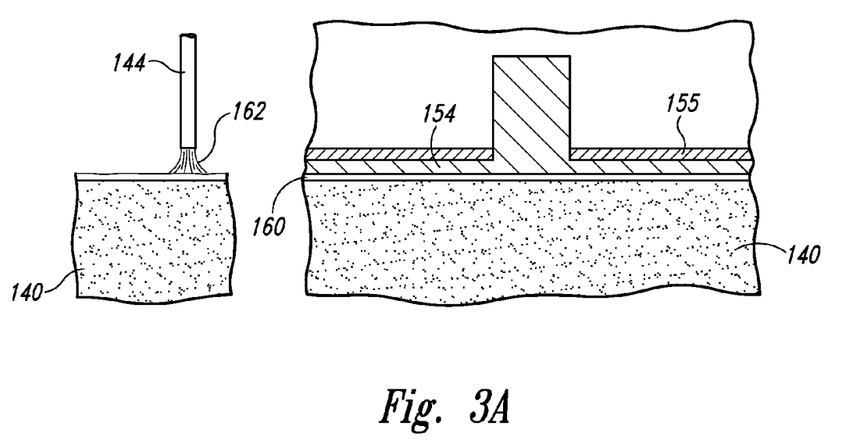
FIG. 3A is a partially schematic cross-sectional illustration of an arrangement for disposing an oxidizing solution adjacent to a semiconductor workpiece in accordance with an embodiment of the disclosure.

As illustrated in FIG. 3A, the excess polysilicon material 154 external to the aperture 153 can be removed during polishing as the semiconductor workpiece 150 rubs against the polishing pad 140 in the presence of the polishing liquid 160. In one embodiment, the polishing solution 160 is premixed with the oxidizing solution 162. In another embodiment, the polishing liquid 160 is pre-dispensed on the semiconductor workpiece 150, and the dispense conduit 144 can subsequently dispense the oxidizing solution 162 onto the workpiece 150 so that the oxidizing solution 162 mixes with the polishing liquid 160 on the polishing pad 140 during processing. In still a further embodiment, described below with reference to FIG. 5, the semiconductor workpiece 150 can be moved from one polishing pad having a first polishing liquid 160a that is not mixed with the oxidizing solution 162, to a second polishing pad having a second polishing liquid 160b that is mixed with the oxidizing solution 162. In any of these embodiments, the polysilicon material 154 of the semiconductor workpiece 150 is exposed to a polishing liquid that contains the oxidizing solution 162 to modify the surface chemistry of the semiconductor workpiece 150.

Figure 3B:
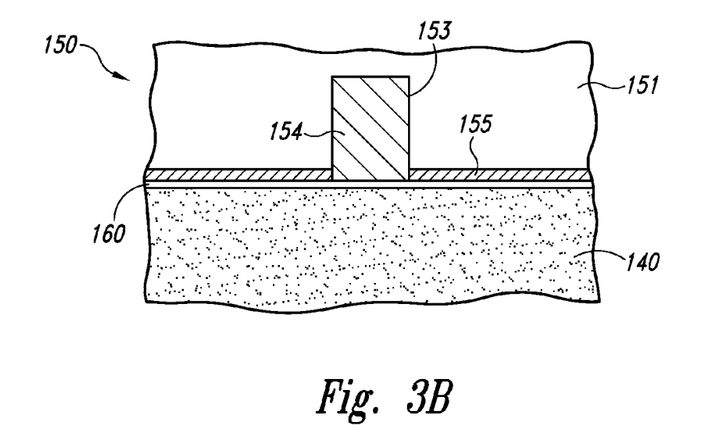
FIG. 3B is a partially schematic cross-sectional illustration of a semiconductor workpiece after having a layer of polysilicon material removed in accordance with an embodiment of the disclosure.

As illustrated in FIG. 3B, the polysilicon material 154 can be removed to the level of the intermediate layer 155. In one embodiment, for example, when the intermediate layer 155 includes an antireflective coating, the material removal process can include removing the intermediate layer 155 to expose the substrate material surface 152. In another embodiment, the intermediate layer 155 can include a stop layer, and the material removal process can be halted upon exposing the intermediate layer 155. In still a further embodiment, as described above, the intermediate layer 155 can be eliminated, and the material removal process can continue through the polysilicon material 154 until the substrate material surface 152 is exposed.

FIGS. 4A-H illustrate stages in a representative process for removing polysilicon material from the workpiece 150 and modifying the surface chemistry of the workpiece 150. Even though only chemical actions are illustrated, the removal process of polysilicon can include mechanical and chemical actions, including synergistic actions. The process is not limited by theory, however, and in other embodiments, the process may be conducted in accordance with other mechanisms. In the illustrated embodiment, the semiconductor workpiece 150 is initially polished using a first polishing liquid 160a for bulk material removal. The first polishing liquid 160a does not contain an oxidizer. The semiconductor workpiece 150 is subsequently polished with a second polishing liquid 160b that does include an oxidizer, which can be either premixed into the second polishing liquid 160b prior to reaching the workpiece 150, or mixed with the second polishing liquid 160b during the CMP process at the surface of the workpiece 150. In particular embodiments, the second polishing liquid

160b can contain about 0.1% to about 1.0% by weight, about 0.001% to about 50.0% by weight, or other suitable concentration of hydrogen peroxide.

In other embodiments, the second polishing liquid 160b can be eliminated. Instead, the first polishing liquid 160a can be mixed with the oxidizing solution 162 prior to or during the CMP process. As a result, the process of polishing the workpiece 150 (e.g., for removing bulk material) and modifying its surface chemistry can occur generally simultaneously.

Figure 4A:
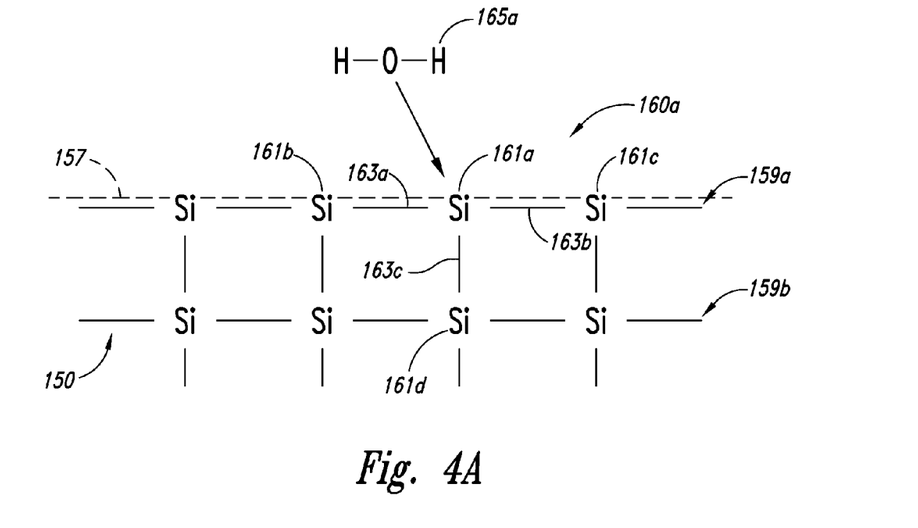
FIGS. 4A-H are schematic cross-sectional illustrations of the surface chemistry of a semiconductor workpiece during a polishing process in accordance with embodiments of the disclosure.

FIG. 4A is a cross-sectional schematic illustration of a portion of the workpiece 150, with a workpiece surface 157 exposed to the first polishing liquid 160a after an overlaying layer (e.g., silicon dioxide, not shown) has been removed. The workpiece surface 157 is shown in phantom lines for clarity. The workpiece 150 includes a first layer 159a and a second layer 159b of polysilicon material at the workpiece surface 157. The first layer 159a includes a first silicon atom 161a, a second silicon atom 161b, and a third silicon atom 161c connected together with first and second Si—Si covalent bonds 163a-b. The second layer 159b includes a fourth silicon atom 161d connected to the first silicon atom 161a with a third Si—Si covalent bond 163c. During polishing, it is believed that multiple reactions with water take place to dislodge silicon atoms from the workpiece surface 157. For example, the first and second silicon atoms 161a-b can react with a first water molecule 165a to form Si—OH and Si—H functional groups, respectively, by breaking the first covalent bond 163a as follows:

$2Si + H_2O \rightarrow Si\text{—}H + Si\text{—}OH$

Figure 4B:
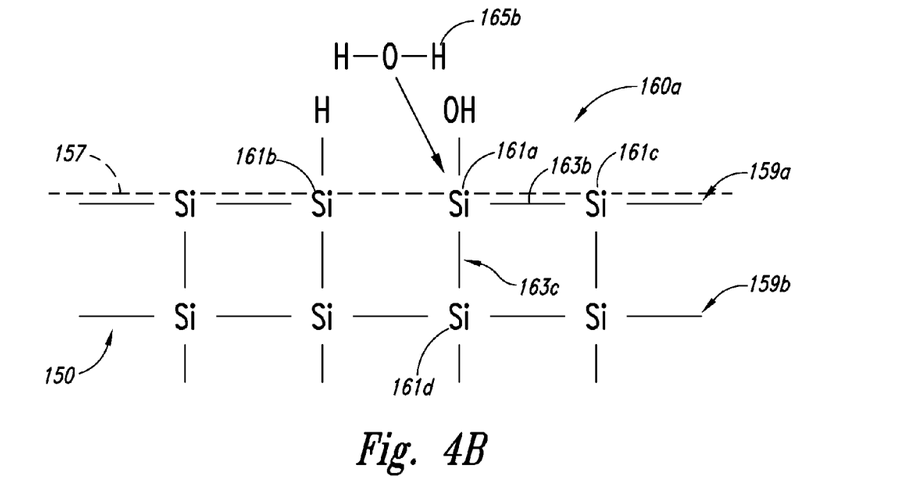

As illustrated in FIG. 4B, the first and second silicon atoms 161a-b are separated from each other. Then, the reaction with water can continue to separate the first silicon atom 161a from other adjacent atoms. For example, the first silicon atom 161a and the third silicon atom 161c can react with a second water molecule 165b to break the second covalent bond 163b and attach another hydroxyl group to the first silicon atom 161a as follows:

$Si + Si\text{—}OH + H_2O \rightarrow Si\text{—}H + OH\text{—}Si\text{—}OH$

Figure 4C:
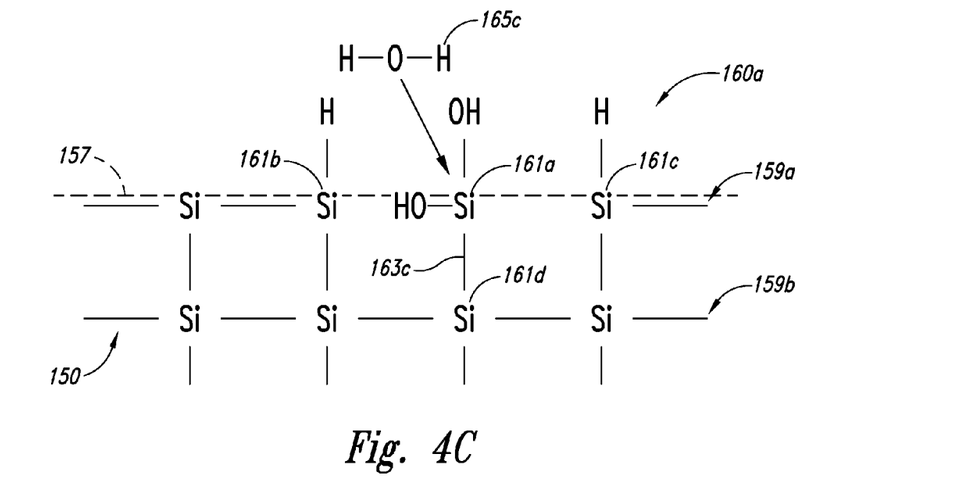

As illustrated in FIG. 4C, the first silicon atom 161a is now separated from both the second and third silicon atoms 161b-c. Then, another reaction with water can occur between a third water molecule 165c, the first silicon atom 161a, and the fourth silicon atom 161d in the second layer 159b before the first silicon atom is removed from the workpiece surface 157 as follows:

$Si + OH\text{—}Si\text{—}OH + H_2O \rightarrow Si\text{—}H + Si\text{—}(OH)_3$

Figure 4D:
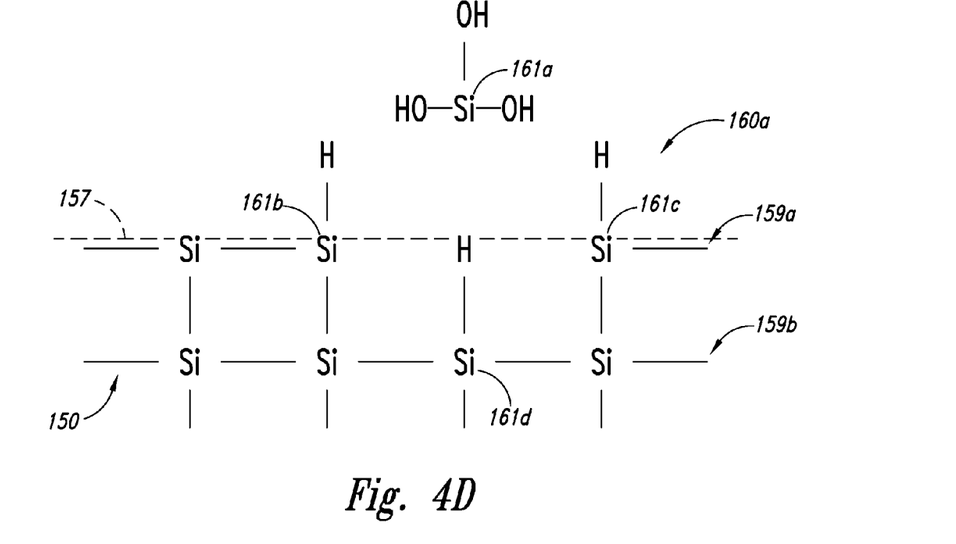

As illustrated in FIG. 4D, at the end of this reaction, the first silicon atom 161a is now dislodged from the workpiece surface 157 because all of the covalent bonds between this atom and the adjacent silicon atoms are broken. At the same time, individual adjacent silicon atoms are converted into Si—H functional groups.

Figure 4E:
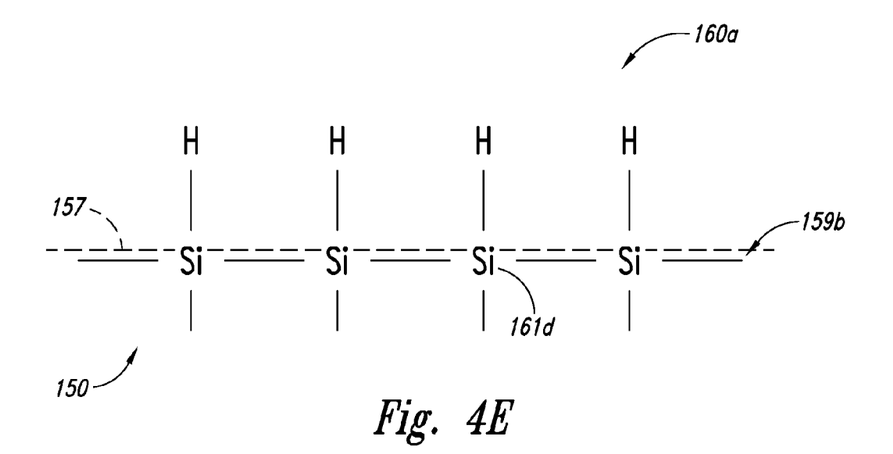

Reacting the neighboring silicon atoms with water in a similar fashion can dislodge the other atoms in the first layer 159a from the workpiece surface 157. FIG. 4E illustrates the workpiece surface 157 after all of the atoms of the first layer 159a of the polysilicon material have been removed. The second layer 159b now includes a plurality of Si—H functional groups having silicon atoms individually connected to a hydrogen atom. It is believed that these hydrogen atoms can cause the workpiece surface 157 to be hydrophobic at least because these Si—H functional groups are not sufficiently polarized. The hydrophobic surface 157 can have poor contact with an adjacent cleaning agent (e.g., de-ionized water) so that adsorbed contaminants at the surface 157 may not be easily disengaged after the CMP process.

Figure 4F:
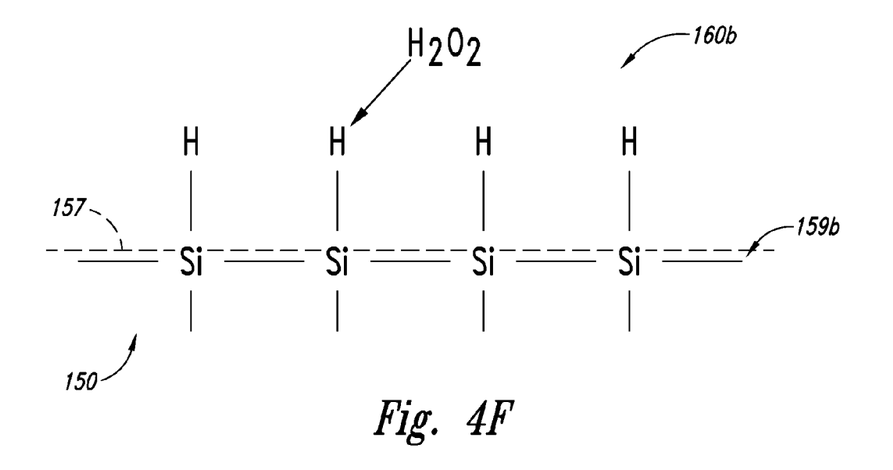

After being polished with the first polishing liquid 160a, the semiconductor workpiece 150 can be polished with the second polishing liquid 160b to remove additional polysilicon material. As illustrated in FIG. 4F, the second polishing liquid 160b contains hydrogen peroxide ($H_2O_2$), which can oxidize the silicon atoms at the workpiece surface 157 to form water and silicon oxide ($Si_xO_y$, where x and y are positive integers). The following reaction is an example reaction, the product of which is silicon dioxide ($SiO_2$), though other silicon oxide compounds may also be formed:

$H_2O_2 + Si\text{—}H \rightarrow H_2O + SiOH$

Hydrogen peroxide can also react with surface silicon to form surface silicon oxide as follows:

$2H_2O_2 + Si \rightarrow 2H_2O + SiO_2$

Figure 4G:
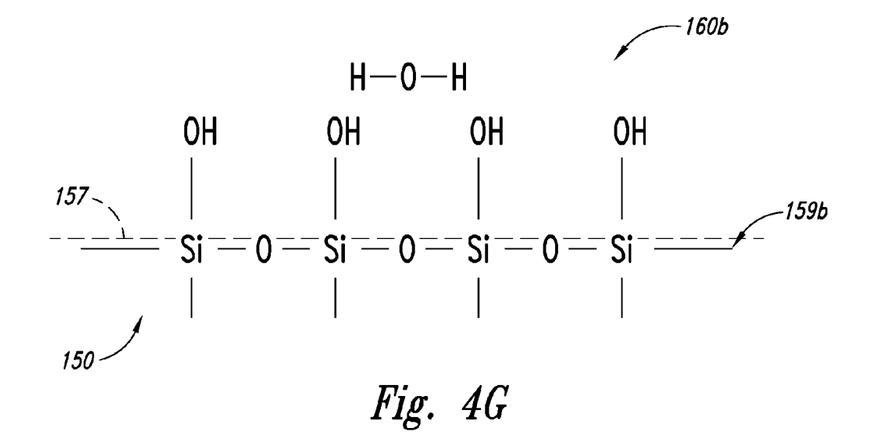

FIG. 4G illustrates the workpiece 150 after reacting with hydrogen peroxide. The workpiece surface 157 now contains a plurality of Si—OH functional groups, and has released water into the second polishing liquid 160b. It is believed that the Si—OH functional groups can at least reduce the hydrophobicity and/or increase the hydrophilicity of the workpiece surface 157 because the Si—OH functional groups are sufficiently polarized. As a result, the ability of the workpiece surface 157 to attract water molecules is modified, and the workpiece surface 157 now tends to be hydrophilic instead of hydrophobic.

Figure 4H:
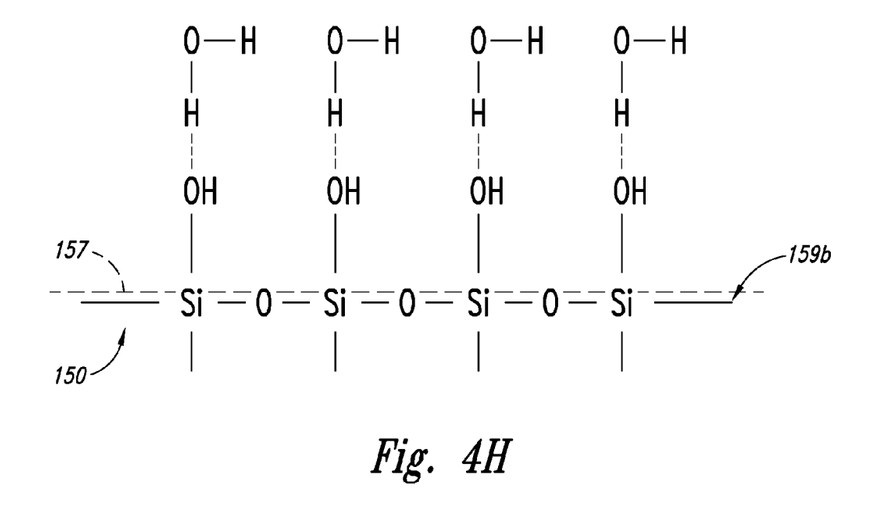
Figure 5:
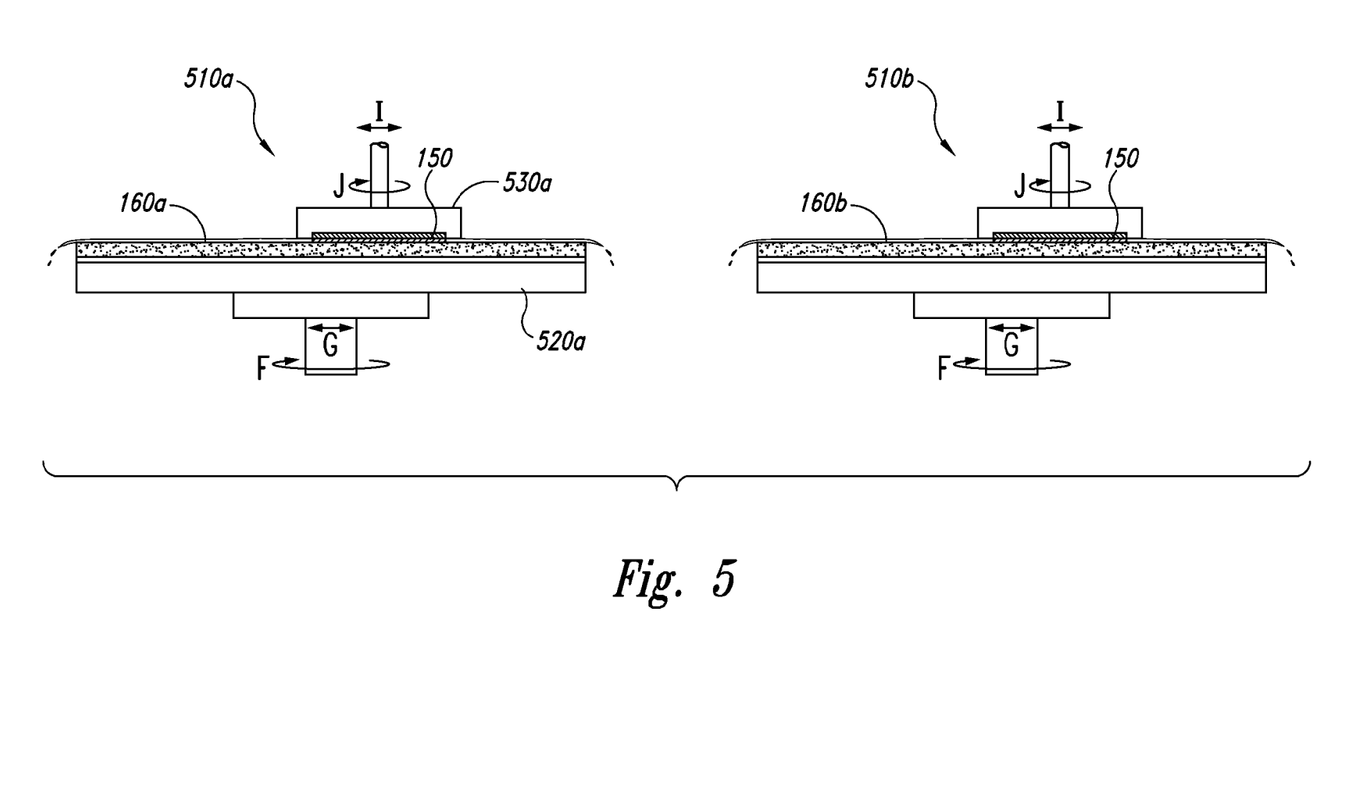
FIG. 5 is a partially schematic illustration of an arrangement of multiple polishing apparatuses for removing polysilicon material from semiconductor workpieces in accordance with an embodiment of the disclosure.

As illustrated in FIG. 4H, the hydrophilic workpiece surface 157 can have improved wettability to the second polishing liquid 160b, a cleaning agent (e.g., de-ionized water), or other water based solutions at least because the workpiece surface 157 is likely to form hydrogen bonds with water molecules in these water based solutions. The improved wettability can enable these water based solutions to carry away adsorbed contaminants from the workpiece surface 157.

The workpiece 150 can then be further polished when the wafer surface 157 undergoes additional reactions with water generally similar to those described above with reference to FIGS. 4A-D. The resulting Si—H functional groups from the reactions with water can be oxidized and the stages illustrated in FIGS. 4A-H can be repeated until a desired removal amount is achieved for the CMP process.

Several embodiments of the foregoing process can reduce the operating costs associated with polishing polysilicon material because expensive post-CMP chemical treatments can be avoided, and simple physical treatments can be used. For example, de-ionized water rinsing, megasonification, brush cleaning, and/or other simple mechanical treatments can now be used to clean the workpiece surface 157. Moreover, several embodiments of the process can improve the quality of the CMP process. As described above, using conventional techniques typically results in adsorbed contaminants (e.g., abrasive elements) on the workpiece surface 157 that cannot be easily removed because of the hydrophobicity of the workpiece surface 157. The contaminants can scratch or otherwise damage the workpiece surface 157 when the workpiece 150 is rubbed against the polishing pad 140. Thus, at least reducing the hydrophobicity of the workpiece surface 157 can improve the contact between the polishing liquid and the workpiece surface 157, and thus reduce the amount of adsorbed contaminants on the workpiece surface 157. As a result, the risk of damaging the workpiece surface 157 during polishing can be reduced.

Further, several embodiments of the process can improve the robustness of the CMP process. For example, adding an oxidizer to the polishing liquid can enable other process parameters (e.g., processing temperatures, pH, amount of polishing force, etc.) to have values outside of the operating ranges associated with conventional processes. By increasing the available operating ranges for these parameters, the processes may be less sensitive to perturbations in these parameter values.

In several embodiments of the process, the oxidizer does not include any metal elements. Metal elements, if included with the oxidizer, could cause silicon contamination that interferes with subsequent metal deposition and processing and/or impacts the electrical property (e.g., the semi-conductive property) of the workpiece. As a result, by using an oxidizer that does not include metal elements, the likelihood of silicon contamination can be reduced or eliminated.

Several embodiments of the process can be at least partially "self-cleaning." It is believed that the Si—OH functional groups at the wafer surface 157 can undergo hydrolysis in a basic solution to become negatively charged as follows:

$$H_2O+Si\text{—}OH \rightarrow H_3O^+ + Si\text{—}O^-$$

It is also believed that contaminants (e.g., abrasive particles) also typically have negatively charged surfaces in a basic solution. The negatively charged wafer surface 157 can thus repel the negatively charged contaminants and reduce the amount of contaminants aggregated, stuck, or otherwise adsorbed onto the wafer surface 157.

In one embodiment, the polysilicon material 154 is removed while remaining in contact with the same polishing pad 140 during the entire process (e.g., as shown in FIG. 2 and FIG. 3). In another embodiment, shown in FIG. 5, a first portion of the polysilicon material 154 can be removed at a first apparatus 510a, and a second portion of the polysilicon material 154 can be removed at a second apparatus 510b. Each apparatus 510a, 510b can include a platen 520 carrying a polishing pad 540 and a carrier 530 configured to support the semiconductor workpiece 150. In one embodiment, each apparatus 510a, 510b includes a polishing pad 540 having the same composition. In another embodiment, the polishing pad 540 of the first apparatus 510a can be different than the polishing pad 540 of the second apparatus 510b. In either embodiment, suitable polishing pads 540 are available from vendors including Rodel of Newark, Del. In either embodiment, the first apparatus 510a can be configured to remove material from the semiconductor workpiece 150 with the first polishing liquid 160a, and the second apparatus 510b can be configured to remove material from the semiconductor workpiece 150 with the second polishing liquid 160b. Accordingly, the first and second polishing liquids 160a, 160b can be kept separate from each other during processing. The chemical compositions of the polishing liquids can be maintained at controlled levels with relative ease.

From the foregoing, it will be appreciated that specific embodiments of the invention have been described herein for purposes of illustration, but that various modifications may be made without deviating from the invention. For example, the processes described with reference to the Figures are used to remove the polysilicon material 154 from the workpiece 150. In other embodiments, these processes can also be used to remove amorphous silicon or single grain silicon. In any of the processes described above, the polishing liquid 160 can include dilute Hydrogen Fluoride (HF), Ammonia Hydroxide (NH₄OH), or other types of cleaning agents in addition to the compounds described above. Certain aspects of the invention described in the context of particular embodiments may be combined or eliminated in other embodiments. For example, the dispense conduit 144 can be eliminated in some embodiments. Further, while features and/or characteristics associated with certain embodiments of the invention have been described in the context of those embodiments, other embodiments may also exhibit such features and/or characteristics, and not all embodiments need necessarily exhibit such features and/or characteristics to fall within the scope of the invention. Accordingly, the invention is not limited, except as by the appended claims.

I claim:

1. A method for processing a semiconductor workpiece, comprising:
    contacting a semiconductor workpiece with a polishing medium, the semiconductor workpiece having a polysilicon material, the polishing medium including a polishing pad and a polishing liquid containing an oxidizer;
    removing at least a portion of the polysilicon material from the semiconductor workpiece with the polishing pad while the polysilicon material contacts the oxidizer in the polishing liquid, thereby forming a surface having adsorbed contaminants; and
    removing the adsorbed contaminants from the surface of the semiconductor workpiece via deionized water rinsing.

2. The method of claim 1 wherein:
    the semiconductor material includes a substrate material having an aperture extending into the substrate material from a substrate material surface;
    the polysilicon material includes a first portion in the aperture and a second portion external to the aperture and on the substrate material surface;
    contacting the semiconductor workpiece includes:
        contacting the polishing pad with the semiconductor workpiece;
        disposing the polishing liquid between the polysilicon material and the polishing pad, the polishing liquid having a plurality of abrasives suspended in a liquid carrier;
    the oxidizer containing about 0.5% to about 5.0% hydrogen peroxide by weight;
    removing at least a portion of the polysilicon material includes:
        moving at least one of the semiconductor workpiece and the polishing pad relative to the other while the semiconductor workpiece contacts the polishing pad and the polishing liquid;
        removing at least a part of the second portion of the polysilicon material from the semiconductor workpiece while at least one of the semiconductor workpiece and the polishing pad is moved relative to the other;
        modifying a hydrophilicity of at least a part of the first portion of the polysilicon material in the aperture of the semiconductor workpiece with the hydrogen peroxide in the oxidizer while removing the second portion of the polysilicon material from the semiconductor workpiece;
    at least some of the adsorbed contaminants include a portion of the abrasives in the polishing liquid;
    removing the adsorbed contaminants includes:
        contacting the surface of the semiconductor workpiece with deionized water; and
        carrying away the portion of the abrasives adsorbed to the surface of the semiconductor workpiece with the deionized water.

3. The method of claim 1 wherein removing at least a portion of the polysilicon material includes modifying a hydrophilicity of a remaining portion of the polysilicon material of the semiconductor workpiece with the oxidizer while removing at least a portion of the polysilicon material from the semiconductor workpiece.

4. The method of claim 1 wherein removing at least a portion of the polysilicon material includes oxidizing a remaining portion of the polysilicon material of the semiconductor workpiece with the oxidizer while removing at least a portion of the polysilicon material from the semiconductor workpiece.

5. The method of claim 1 wherein removing at least a portion of the polysilicon material includes increasing a wettability to water of a remaining portion of the polysilicon material of the semiconductor workpiece with the oxidizer while removing at least a portion of the polysilicon material from the semiconductor workpiece.

6. The method of claim 1 wherein removing at least a portion of the polysilicon material includes:
    moving at least one of the semiconductor workpiece and the polishing pad relative to the other while the semiconductor workpiece contacts the polishing pad and the polishing liquid; and
    removing a first portion of the polysilicon material from the semiconductor workpiece while at least one of the semiconductor workpiece and the polishing pad is moved relative to the other; and
    wherein a second portion of the polysilicon material remaining in the semiconductor workpiece is generally hydrophilic.

7. The method of claim 1 wherein removing at least a portion of the polysilicon material includes:
    moving at least one of the semiconductor workpiece and the polishing pad relative to the other while the semiconductor workpiece contacts the polishing pad and the polishing liquid;
    removing a first portion of the polysilicon material from the semiconductor workpiece while at least one of the semiconductor workpiece and the polishing pad is moved relative to the other; and
    oxidizing a second portion of the polysilicon material remaining in the semiconductor workpiece with the oxidizer while removing the first portion of the polysilicon material from the semiconductor workpiece.

8. The method of claim 1 wherein removing at least a portion of the polysilicon material includes:
    moving at least one of the semiconductor workpiece and the polishing pad relative to the other while the semiconductor workpiece contacts the polishing pad and the polishing liquid;
    removing a first portion of the polysilicon material from the semiconductor workpiece while at least one of the semiconductor workpiece and the polishing pad is moved relative to the other;
    oxidizing a second portion of the polysilicon material remaining in the semiconductor workpiece with the oxidizer while removing the first portion of the polysilicon material from the semiconductor workpiece; and
    removing the adsorbed contaminants includes:
        contacting the second portion of the polysilicon material of the semiconductor workpiece with deionized water; and
        carrying away at least a portion of the adsorbed contaminants from the semiconductor workpiece with the deionized water.

9. The method of claim 1 wherein removing at least a portion of the polysilicon material includes:
    moving at least one of the semiconductor workpiece and the polishing pad relative to the other while the semiconductor workpiece contacts the polishing pad and the polishing liquid;
    removing a first portion of the polysilicon material from the semiconductor workpiece while at least one of the semiconductor workpiece and the polishing pad is moved relative to the other;
    oxidizing a second portion of the polysilicon material remaining in the semiconductor workpiece with the oxidizer while removing the first portion of the polysilicon material from the semiconductor workpiece; and
    removing the adsorbed contaminants includes:
        wetting the second portion of the polysilicon material of the semiconductor workpiece with deionized water; and
        carrying away at least a portion of the adsorbed contaminants from the semiconductor workpiece with the deionized water.

10. A method for processing a semiconductor workpiece, comprising:
    contacting a semiconductor workpiece with a polishing medium, the semiconductor workpiece having a polysilicon material, the polishing medium including a polishing pad and a polishing liquid containing an oxidizer;
    removing a first portion of the polysilicon material from the semiconductor workpiece with the polishing medium;
    modifying a surface charge of a second portion of the polysilicon material with the oxidizer while removing the first portion of the polysilicon material, the second portion of the polysilicon material remaining in the semiconductor workpiece; and
    repelling contaminants in the polishing medium from the semiconductor workpiece with the modified surface charge of the second portion of the polysilicon material.

11. The method of claim 10 wherein:
    the polishing liquid includes a plurality of abrasives suspended in a liquid carrier;
    at least a portion of the abrasives are negatively charged;
    modifying the surface charge of the semiconductor workpiece includes hydrolyzing at least a part of the second portion of the polysilicon material to be negatively charged; and
    repelling the contaminants in the polishing medium includes repelling the negatively charged abrasives with the negatively charged second portion of the polysilicon material.

12. The method of claim 10 wherein:
    removing the first portion of the polysilicon material includes:
        reacting silicon atoms of the polysilicon material to form Si—H and Si—OH functional groups; and
        dislodging silicon atoms carrying the Si—OH functional groups from the semiconductor workpiece;
    modifying the surface charge of the second portion of the polysilicon material includes:
        oxidizing the Si—H functional groups while the silicon atoms carrying the formed Si—OH functional groups are dislodged from the semiconductor workpiece; and
        forming a surface of the semiconductor workpiece containing at least some Si—OH functional groups.

13. The method of claim 10 wherein:
removing the first portion of the polysilicon material includes:
- reacting silicon atoms of the polysilicon material to form Si—H and Si—OH functional groups; and
- dislodging silicon atoms carrying the Si—OH functional groups from the semiconductor workpiece;

modifying the surface charge of the second portion of the polysilicon material includes:
- oxidizing the Si—H functional groups while the silicon atoms carrying the formed Si—OH functional groups are dislodged from the semiconductor workpiece;
- forming a surface of the semiconductor workpiece containing at least some Si—OH functional groups; and
- hydrolyzing at least a part of the second portion of the polysilicon material with a basic solution as follows:

$H_2O + Si—OH \rightarrow H_3O^+ + Si—O^-$.

14. The method of claim 10 wherein:
removing the first portion of the polysilicon material includes:
- reacting silicon atoms of the polysilicon material to form Si—H and Si—OH functional groups; and
- dislodging silicon atoms carrying the Si—OH functional groups from the semiconductor workpiece;

modifying the surface charge of the second portion of the polysilicon material includes:
- oxidizing the Si—H functional groups while the silicon atoms carrying the formed Si—OH functional groups are dislodged from the semiconductor workpiece;
- forming a surface of the semiconductor workpiece containing at least some Si—OH functional groups;
- hydrolyzing at least a part of the second portion of the polysilicon material with a basic solution as follows:

$H_2O + Si—OH \rightarrow H_3O^+ + Si—O^-$.

at least a portion of the abrasives are negatively charged; and
repelling the contaminants in the polishing medium includes repelling the negatively charged contaminants in the polishing medium with the Si—O$^-$ functional groups of the second portion of the polysilicon material.

15. A method for processing a semiconductor workpiece, comprising, comprising:
- contacting a semiconductor workpiece having a polishing medium, the semiconductor workpiece having a polysilicon material, the polishing medium containing an oxidizer;
- reacting silicon atoms of the polysilicon material with the polishing medium to form Si—H and Si—OH functional groups;
- dislodging silicon atoms of the polysilicon material carrying the Si—OH functional groups from the semiconductor workpiece;
- oxidizing the Si—H functional groups while the silicon atoms carrying the formed Si—OH functional groups are dislodged from the semiconductor workpiece, and thereby forming a surface of the semiconductor workpiece containing Si—OH functional groups;
- contacting the surface of the semiconductor workpiece with deionized water;
- forming a plurality of hydrogen bonds between the Si—OH functional groups at the second surface and water molecules of the deionized water; and
- removing contaminants from the surface of the semiconductor workpiece with the water molecules of the deionized water.

16. The method of claim 15, further comprising converting the Si—H functional groups of the polysilicon material into silicon oxide ($Si_xO_y$, where x and y are positive integers) after the oxidizer reacts with the polysilicon material.

17. The method of claim 15, further comprising converting the Si—H functional groups of the polysilicon material into silicon dioxide (SiO2) after the oxidizer reacts with the polysilicon material.

18. The method of claim 15 wherein reacting the Si—H functional groups with an oxidizer includes reacting the Si—H functional groups with hydrogen peroxide.

19. The method of claim 15 wherein reacting the Si—H functional groups with an oxidizer includes releasing water after the oxidizer reacts with the polysilicon material.

* * * * *